(12) United States Patent
Saunders

(10) Patent No.: US 9,147,701 B2
(45) Date of Patent: Sep. 29, 2015

(54) MONOLITHIC INGAN SOLAR CELL POWER GENERATION WITH INTEGRATED EFFICIENT SWITCHING DC-DC VOLTAGE CONVERTOR

(75) Inventor: Jeffrey H. Saunders, Andover, MA (US)

(73) Assignee: RAYTHEON COMPANY, Waltham, MA (US)

( * ) Notice: Subject to any disclaimer, the term of this patent is extended or adjusted under 35 U.S.C. 154(b) by 48 days.

(21) Appl. No.: 13/240,991

(22) Filed: Sep. 22, 2011

(65) Prior Publication Data

US 2013/0074907 A1 Mar. 28, 2013

(51) Int. Cl.
*H01L 31/042* (2014.01)
*H01L 27/142* (2014.01)

(52) U.S. Cl.
CPC ............. *H01L 27/142* (2013.01); *Y02E 10/50* (2013.01)

(58) Field of Classification Search
CPC combination set(s) only.
See application file for complete search history.

(56) References Cited

U.S. PATENT DOCUMENTS

| | | | |
|---|---|---|---|
| 5,593,901 A * | 1/1997 | Oswald et al. ................ 438/80 |
| 6,462,360 B1 * | 10/2002 | Higgins et al. .............. 257/189 |
| 6,492,937 B1 * | 12/2002 | Sparrow et al. .............. 342/125 |
| 7,226,850 B2 | 6/2007 | Hoke et al. |
| 7,902,809 B2 | 3/2011 | Briere et al. |
| 8,329,503 B1 * | 12/2012 | Nielson et al. ............... 438/98 |
| 2002/0047649 A1 * | 4/2002 | Fregoso et al. .............. 315/362 |
| 2003/0172968 A1 * | 9/2003 | Armer et al. ................ 136/244 |
| 2006/0086973 A1 * | 4/2006 | Hitani et al. ................ 257/335 |
| 2006/0152287 A1 * | 7/2006 | Greene ....................... 330/296 |
| 2007/0024257 A1 * | 2/2007 | Boldo ......................... 323/282 |
| 2009/0086517 A1 * | 4/2009 | Wei et al. ...................... 363/50 |
| 2010/0020582 A1 * | 1/2010 | MacDonald et al. ......... 363/142 |
| 2010/0194371 A1 * | 8/2010 | Satou et al. .................. 323/288 |
| 2010/0229921 A1 * | 9/2010 | Farris et al. .................. 136/249 |
| 2010/0259231 A1 * | 10/2010 | McCune, Jr. ................. 323/225 |
| 2010/0264210 A1 * | 10/2010 | Kao ............................. 235/380 |
| 2011/0003566 A1 * | 1/2011 | Makihara et al. .......... 455/127.1 |
| 2011/0080156 A1 | 4/2011 | Briere et al. |
| 2011/0180857 A1 * | 7/2011 | Hoke et al. .................. 257/255 |
| 2011/0203666 A1 * | 8/2011 | Lebby et al. ................. 136/261 |
| 2012/0074920 A1 * | 3/2012 | Callanan ..................... 323/311 |
| 2012/0118383 A1 * | 5/2012 | Bedell et al. ................ 136/261 |

OTHER PUBLICATIONS

Keller et al, Gallium Nitride Based High Power Heterojunction Field Effect Transistors: Process Development and Present Status at UCSB, IEEE Transactions on Electron Devices, vol. 48, No. 3, Mar. 2001.*

* cited by examiner

*Primary Examiner* — Eli Mekhlin
(74) *Attorney, Agent, or Firm* — Christie, Parker & Hale, LLP

(57) ABSTRACT

A single monolithic integrated circuit (10) containing a solar cell (or cells) with a DC-DC converter includes: a substrate (120, 220); the solar cell (101) or a solar cell array (100, 100') on the substrate for generating an output voltage; and the DC-DC converter (102) integrated on the substrate for receiving the output voltage to generate a converted voltage, which may be higher or lower than the solar generated voltage. The substrate may be a silicon <111>, silicon carbide, or sapphire substrate. A GaN RF power amplifier and a CMOS controller including PWM modulator may also be monolithically integrated with an InGaN solar cell array and a GaN DC-DC converter. GaN switches (113, 115, 117, 119) may be used to couple InGaN solar cells (101) in series or parallel within the solar cell array (100, 100') to yield improved or optimal voltage and current levels as required by the load.

14 Claims, 10 Drawing Sheets

MONOLITHIC INGAN SOLAR CELL POWER GENERATION WITH INTEGRATED EFFICIENT SWITCHING DC-DC VOLTAGE CONVERTOR

BACKGROUND

1. Field

One or more aspects of embodiments according to the present invention relate to solar cells and a voltage converter (e.g., a DC-DC converter), and in particular, to solar cells used with a voltage converter.

2. Description of Related Art

Solar cells are used for renewable power generation in many applications. DC-DC voltage converters are used to step up or step down voltages to those required by a load. Further, in remote locations (e.g., desert) that are difficult to access, solar cells may provide renewable energy to power electric/electronic devices.

SUMMARY

It is desirable to be able to provide voltage conversion of voltage output by solar cells with high efficiency.

In embodiments according to the present invention, power generation feature of a solar cell (or solar cells) is integrally combined with a DC-DC converter that boosts the solar cell generated voltage to a more suitable voltage for a specific load. In other embodiments, a solar cell (or solar cells) is integrally (e.g., monolithically) combined with a DC-DC converter that reduces the solar cell generated voltage for applications that require a lower voltage. In still other embodiments, the DC-DC converter integrated with a solar cell (or solar cells) may be controllable to either boost or reduce the voltage generated by the solar cell (or solar cells). Such monolithic integration may reduce or minimize the area occupied by the solar cell (or solar cells) and the DC-DC converter.

Further, in embodiments according to the present invention, the proximity of the power generating solar cells with the switch matrix and DC-DC converter allows the controller to maintain a desired output voltage range over various environmental conditions, while providing an optimal charge current to the battery, thereby enabling prolonged remote operation of electrical equipment, including sensors and communications equipment.

In one embodiment, both the solar cell (or solar cells) and the DC-DC converter form a monolithic InGaN/GaN integrated circuit.

In another embodiment, a monolithic implementation of an InGaN/GaN solar cell, GaN DC-DC converter, and GaN power amplifier (PA) is provided.

In yet another embodiment, all three of the InGaN/GaN solar cell, GaN DC-DC converter, and GaN PA are integrated on a silicon substrate that provides an embedded controller to achieve a complete system-on-chip (SOC) integrated circuit.

In yet another embodiment, a series of GaN switches may be used to configure the array of solar cells for optimal current and voltage output. For example, the GaN switches may be used to selectively couple the solar cells in serial or parallel configurations.

In yet another embodiment, an audio amplifier may be monolithically integrated with a solar cell (or solar cells) and a DC-DC converter on a common substrate.

In example embodiments according to the present invention, a single monolithic integrated circuit containing a solar cell or solar cells with a voltage converter, includes: a substrate; a solar cell or a solar cell array comprising the solar cells, on the substrate and configured to generate an output voltage; and the voltage converter integrally formed on the substrate with the solar cell or the solar cell array, the voltage converter being configured to receive the output voltage and to generate a converted voltage.

The solar cell array may include indium gallium nitride (InGaN) solar cells or silicon solar cells.

The InGaN solar cells may include at least first and second InGaN layers having different content ratios of indium (In) and gallium (Ga) with respect to each other.

The first and second InGaN layers may be stacked one on top of another, so as to absorb different regions of solar spectrum of same solar rays.

The single monolithic integrated circuit may further include gallium nitride (GaN) RF power amplifier (RF PA) integrally formed on the substrate with the InGaN solar cell array and the voltage converter.

The voltage converter may include a GaN DC-DC converter.

The GaN DC-DC converter may include a buck converter, a boost converter, or a buck-boost converter.

The single monolithic integrated circuit may further include a controller integrated on the same substrate with the InGaN solar cell array and the voltage converter.

The substrate may include a silicon substrate.

The controller may be a CMOS controller.

The CMOS controller may include a PWM controller configured to generate PWM signals to control the voltage converter.

The solar cell array may further include a plurality of switches configured to couple the InGaN solar cells in parallel or serial configuration.

The plurality of switches may include GaN switches integrally formed on the same substrate as the InGaN solar cell array.

The substrate may be a silicon carbide (SiC) substrate, a sapphire substrate, or a silicon substrate.

BRIEF DESCRIPTION OF THE DRAWINGS

The above and other features and aspects of the present invention will become more apparent by describing in detail exemplary embodiments thereof with reference to the attached drawings.

DETAILED DESCRIPTION

In embodiments according to the present invention, a monolithic chip includes one or more indium gallium nitride (InGaN) solar cells with a gallium nitride (GaN) DC-DC buck-boost converter. An external control circuit (e.g., including a feedback loop) senses the voltage produced by the solar cell(s) and determines the output voltage to be above or below the value produced by the solar cells by controlling the buck-boost converter. By using InGaN photovoltaics co-located (e.g., monolithically integrated) on the chip with efficient power conversion of GaN switching FETs (e.g., HEMTs), efficient generation and conversion of power from solar energy may be achieved. The GaN switching FETs may have a low DC on-resistance, and therefore, an efficient power conversion system may be realized.

In one embodiment, the solar cells and the DC-DC converter include a single InGaN/GaN integrated circuit, and the output voltage is electrically coupled to a small rechargeable battery.

In another embodiment, a GaN RF Power Amplifier is also integrated monolithically with the solar cell(s) and the DC-DC converter.

In yet another embodiment, a number of GaN switches are also integrated and configured by the controller to configure the solar cells in either series or parallel arrangements to satisfy the current and voltage requirements of the load.

The proximity of the power generating solar cells with the switch matrix and DC-DC converter allows the controller to maintain a desired output voltage range over various environmental conditions, while providing an optimal charge current to the battery, thereby enabling prolonged remote operation of electrical equipment, including sensors and communications equipment.

Embodiments of the present invention will be more clearly understood from the following detailed description taken in conjunction with the accompanying drawings. FIGS. 1 to 9B represent non-limiting, example embodiments as described herein. For example, while embodiments of the present invention are described primarily in reference to GaN transistors (e.g., HEMTs), InGaN solar cells, GaN switches, and a CMOS controller that are monolithically integrated on a silicon or silicon carbide substrate, the present invention is not limited thereto. Those skilled in the art would appreciate, based on the disclosures herein, that any other suitable materials and fabrication methods may be used to practice the disclosed embodiments of the present invention. For example, the solar cells may be silicon solar cells, and the substrate may be a sapphire substrate.

Figure 1:
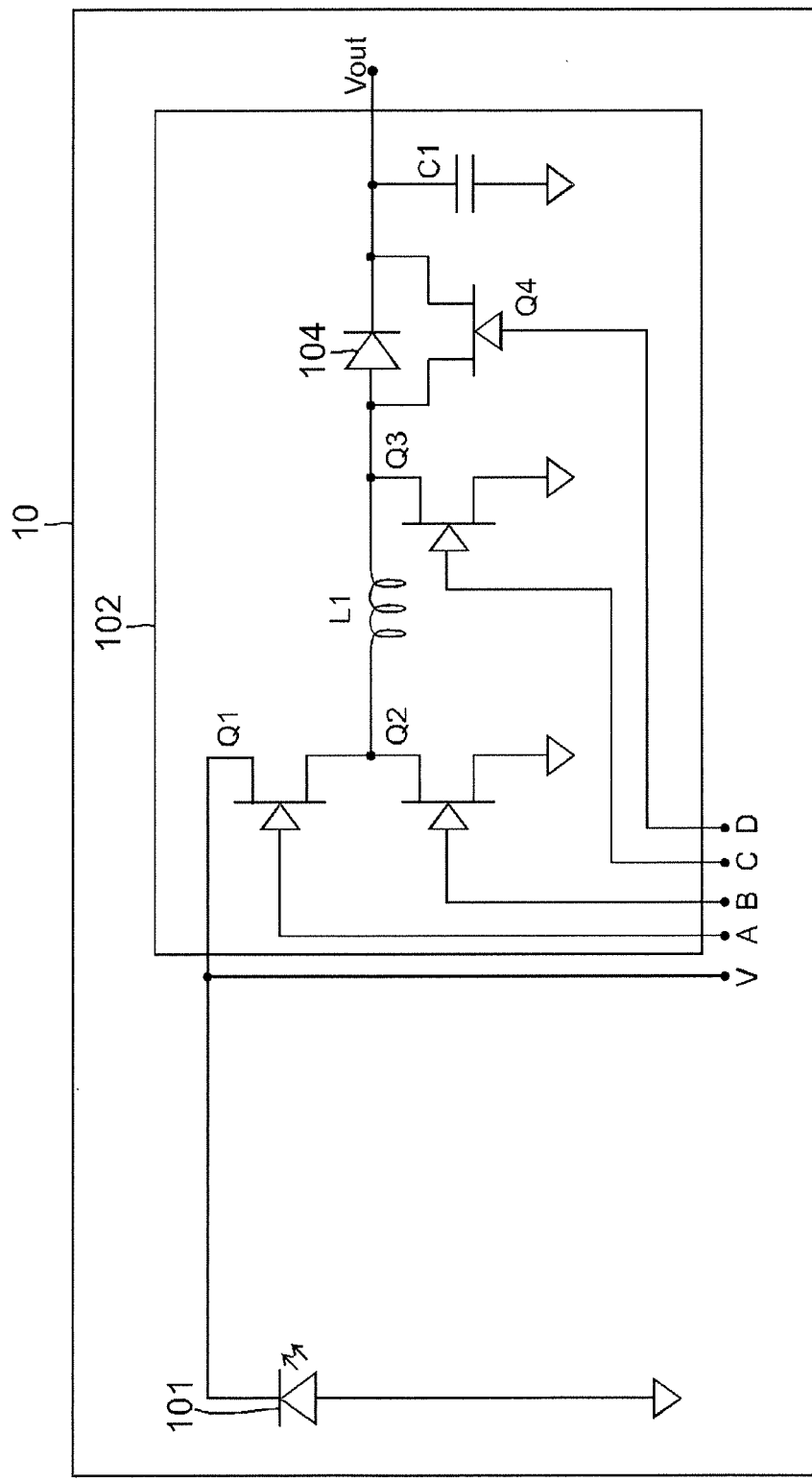
FIG. 1 is a schematic circuit diagram of a single monolithic integrated circuit containing a solar cell coupled to a voltage converter according to an embodiment of the present invention.
Figure 2:
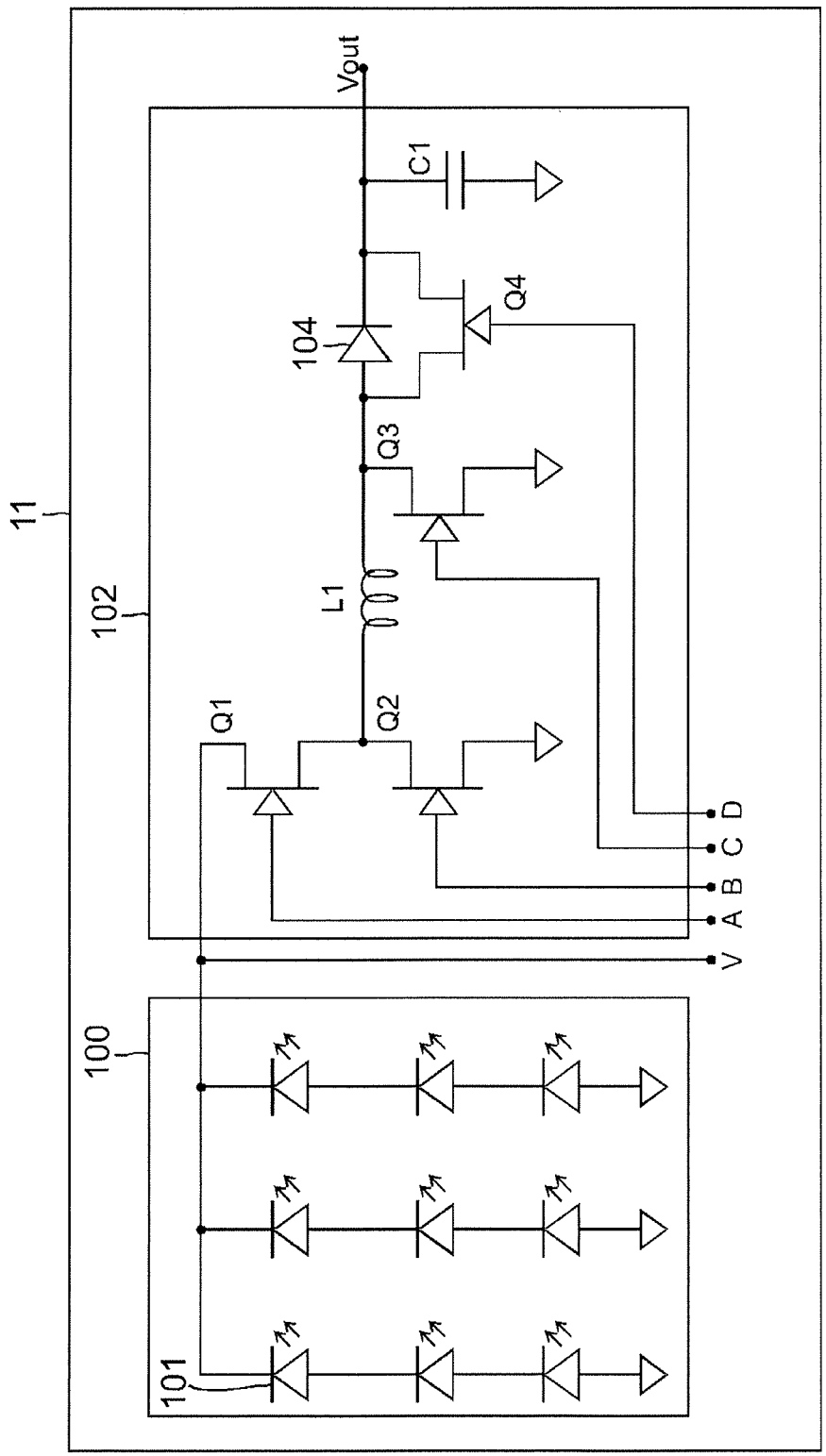
FIG. 2 is a schematic circuit diagram of a single monolithic integrated circuit containing a solar cell array including solar cells, and coupled to a voltage converter according to an embodiment of the present invention.

FIG. 1 is a schematic circuit diagram of a single monolithic integrated circuit 10 containing a solar cell 101 coupled to a voltage converter, such that the solar cell and the voltage converter are co-located on the same chip (e.g., same integrated circuit (IC) chip), according to an embodiment of the present invention. FIG. 2 is a schematic circuit diagram of a single monolithic integrated circuit 11 containing a solar cell array 100 including solar cells 101 (e.g., InGaN solar cells), and coupled to a voltage converter 102 (e.g., GaN DC-DC converter), such that the solar cell array 100 and the voltage converter 102 are co-located on the same chip, according to an embodiment of the present invention. While the solar cell array 100 is illustrated in FIG. 1 as including nine (9) solar cells in a 3×3 matrix configuration, the present invention is not limited thereto, and embodiments of the present invention may include any suitable number of solar cells ranging from a single solar cell to a solar cell array. As the single monolithic integrated circuit 10 of FIG. 1 is substantially the same as that of FIG. 2 except that the single monolithic integrated circuit of FIG. 1 includes only a single solar cell, FIGS. 1 and 2 will be described together below.

The solar cells 101 in the solar cell array 100 of FIG. 2 are shown as being arranged in three columns, with each column including three solar cells coupled in series. The three solar cells in series in the same column in one embodiment are identical to each other, and the series arrangement is being used to increase the voltage output of the solar cells. In other embodiments, the three solar cells arranged in series in the same column may represent three solar cells that are stacked together (e.g., multiple junction or multi junction solar cells) and configured to generate power in response to different regions of spectrum of sun light, such that different region of spectrum of the sun light incident on the solar cell stack is converted into power by a different layer of the solar cells in the stack.

For example, a single solar cell may be a triple junction cell that includes three separate junctions for absorbing three different regions of the solar spectrum. These different junctions may be realized by varying the relative contents or concentrations of gallium (Ga) and indium (In) in different InGaN layers within the solar cell. The number of layers and junctions in solar cells may be limited by the energy of the sun light to penetrate through the solar cells. While InGaN solar cells may have advantages such as lower resistance and high breakdown voltage, the present invention is not limited thereto, and silicon solar cells (for example, see FIG. 6B) may be used for monolithic integration on a common substrate.

The voltage converter 102 includes first and second transistors (e.g., HEMTs) Q1 and Q2 that are coupled in series between an output V of the solar cell array 100 and a reference voltage (e.g., ground). The gates of the first and second transistors Q1 and Q2 are coupled to control signals A and B, respectively. A node between the transistors Q1 and Q2 is coupled to a first end of an inductor L1. A second end of the inductor L1 is coupled to a drain of a third transistor (e.g., HEMT) Q3. A source of the third transistor Q3 is coupled to a reference voltage (e.g., ground). The voltage at the drain of the third transistor Q3 is provided through a diode 104 as an output Vout of the voltage converter 102. A fourth transistor (e.g., HEMT) Q4 is coupled in parallel to the diode 104 between the second end of the inductor L1 and a voltage output Vout of the voltage converter 102. A capacitor C1 is coupled between the voltage output Vout and a reference voltage (e.g., ground). Gates of the third and fourth transistors Q3 and Q4 are configured to receive control signals C and D, respectively.

Figure 3:
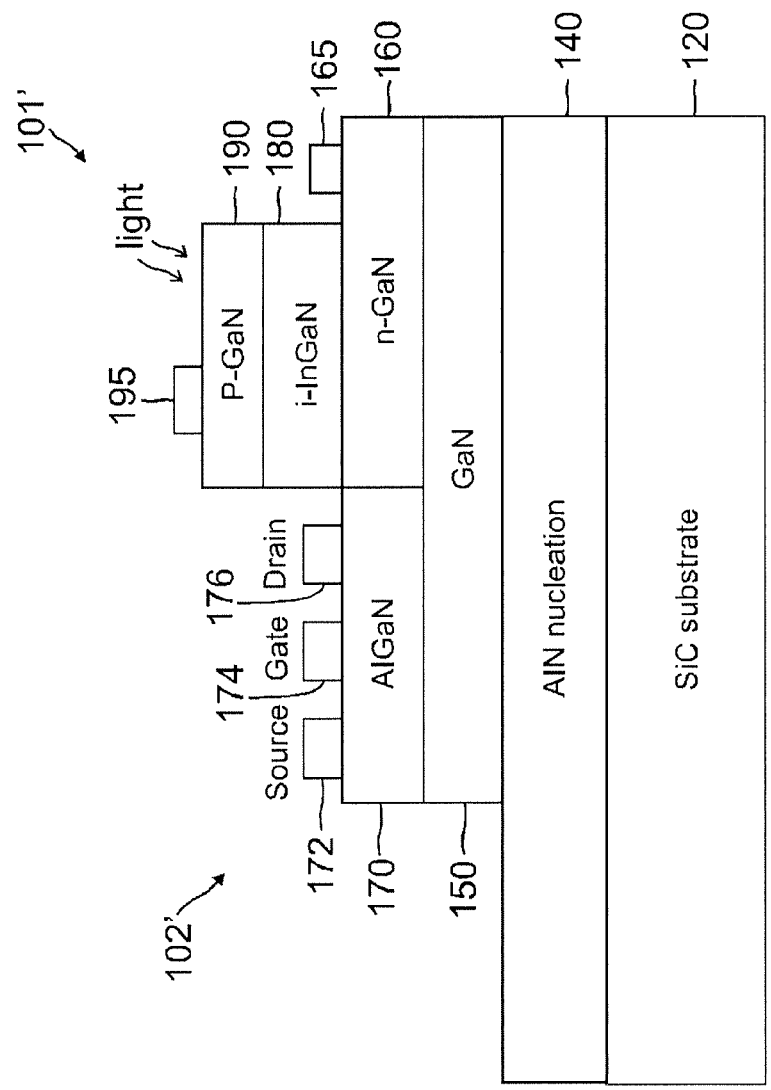
FIG. 3 is a schematic cross-sectional diagram of a transistor (e.g., a high electron mobility transistor (HEMT)) and a solar cell integrated (e.g., monolithically integrated) on a substrate according to an embodiment of the present invention.

The solar cell 101 of FIG. 1 and the solar cells 101 of FIG. 2 may be InGaN solar cells and the transistors Q1, Q2, Q3 and Q4 may be GaN transistors according to an embodiment of the present application. FIG. 3 is a schematic cross-sectional diagram that shows a GaN transistor (e.g., HEMT) 102' and a solar cell 101' that are integrated (e.g., monolithically integrated) on a common substrate (e.g., SiC substrate), such that the GaN transistor 102' and the solar cell 101' are co-located on the same chip. Here, the GaN transistor 102' may be a GaN high electron mobility transistor (HEMT).

In the integrated structure of an InGaN solar cell and a GaN transistor (e.g., HEMT) illustrated in FIG. 3, first, an aluminum nitride (AlN) nucleation layer ("AlN layer") 140 is formed on a silicon carbide (SiC) substrate 120. Then a first GaN layer 150 is formed on the AlN layer 140 to a thickness of about 2 μm, for example. The transistor (e.g., HEMT) is formed in the first GaN layer 150, which is covered by a layer of aluminum gallium nitride (AlGaN) 170, which may have a thickness of about 25 nm, for example. These and other thicknesses provided and shown herein are for example purposes only, and the present invention is not limited thereto. Further, the thicknesses of the layers are not drawn to scale. Electrical contacts (or electrodes) 172, 174 and 176 are formed on the AlGaN layer 170 to correspond to source, gate and drain regions, respectively. Those skilled in the art would know that while the source and drain electrodes 172 and 176 may form an ohmic contact with the source and drain regions, respectively, of the AlGaN layer 170, the gate electrode 174 may form a Schottky contact.

FIG. 3 depicts a formation of a GaN transistor (e.g., GaN HEMT) in one embodiment, but the present invention is not limited thereto. In other embodiments, any other suitable processes may be used as those skilled in the art would appreciate. For example, a fabrication process for GaN transistors (e.g., GaN HEMTs) is disclosed in U.S. Pat. No. 7,226,850 entitled "Gallium Nitride High Electron Mobility Transistor Structure," the entire content of which is incorporated herein by reference. For example, in other embodiments, a GaN cap layer (not shown) may be grown on top of the AlGaN layer 170 between the AlGaN layer 170 and the source, gate and drain electrodes 172, 174 and 176.

The InGaN solar cell 101' is integrated (or integrally formed) on the same SiC substrate as the GaN transistor (e.g., GaN HEMT) 102'. First, after forming the first GaN layer 150 on the AlN layer 140, a second GaN layer 160 is formed on the first GaN layer 150 and doped with n-type material, for example, silane. The first GaN layer, for example, may have a thickness of 2 μm. The second GaN layer 160, for example, may have a thickness of 350 nm.

The thicknesses of the layers provided throughout this specification are for illustrative purposes only, and the present invention is not limited to any particular thickness of any particular layer.

Then an InGaN layer 180 (e.g., intrinsic InGaN layer or i-InGaN layer) is grown on the second GaN layer 160. The InGaN layer 180, for example, may be grown using molecular beam epitaxy (MBE), and may have a thickness of 150 nm, for example. The InGaN epitaxial layer may be grown at 750° C., for example. On top of the InGaN layer 180, a third GaN layer 190 is formed and doped with p-type material, for example, magnesium (Mg). For example, the Ga source may include trimethylgallium, N source may include ammonia, and In source may include trimethylindium, but the present invention is not limited thereto. The thickness of the third GaN layer 190, for example, may be 50 nm.

The absorption coefficient α of $In_{0.1}Ga_{0.9}N$ is $1\times10^5/$cm=$10^{-2}$/nm. Because 95% of the light is absorbed within $3\times(1/\alpha)$=300 nm, and 99% of the light is absorbed within $5\times(1/\alpha)$=500 nm, according to embodiments of the present invention, the thicknesses of the second GaN layer 160, the intrinsic InGaN layer 180, and the third GaN layer 190, may be adjusted to improve or optimize light absorption.

An n-contact 165 is formed on the second GaN layer 160. The n-contact may be formed of any suitable metal such as an alloy of titanium/aluminum (Ti/Al) or titanium/gold (Ti/Au) or any other suitable material known to those skilled in the art. A p-contact 195 is formed on the third GaN layer 190. The p-contact may be formed of any suitable metal such as an alloy of nickel/gold (Ni/Au) or palladium/gold (Pd/Au), or any other suitable material known to those skilled in the art.

While an example of InGaN solar cell is depicted in FIG. 3 for illustrative purposes, those skilled in the art would know that many other variations of InGaN solar cells having different structures may be implemented in other embodiments. Also, while the present invention is primarily described in reference to InGaN solar cells and GaN switches/transistors (e.g., GaN HEMTs), the present invention is not limited thereto, and any other suitable materials, structures, and fabrication processes for solar cells, switches and other integrated circuitry may be used to integrate monolithically integrate heterogeneous devices on a common substrate.

Figure 4:
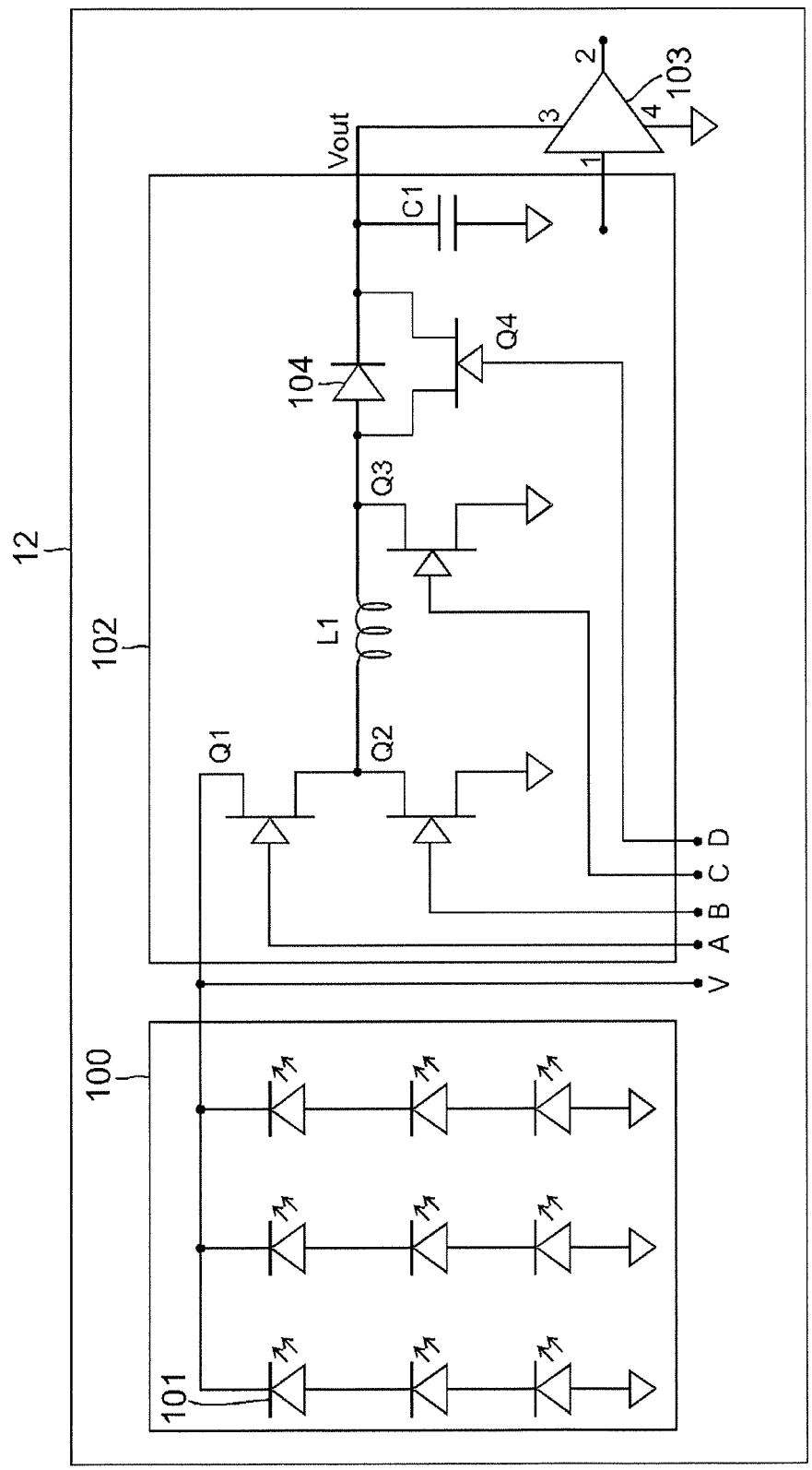
FIG. 4 is a schematic circuit diagram of a single monolithic integrated circuit containing a solar cell array including solar cells, and coupled to a voltage converter and an amplifier according to an embodiment of the present invention.

FIG. 4 is a schematic circuit diagram of a single monolithic integrated circuit 12 containing a solar cell array 100 including solar cells (e.g., InGaN solar cells) 101, and coupled to a voltage converter (e.g., GaN DC-DC converter) 102 and an amplifier 103, such that the solar cell array 100, the voltage converter, and the amplifier are co-located on the same chip, according to an embodiment of the present invention. The integrated structure of the solar cell array 100 and the voltage converter 102 illustrated in FIG. 4 is substantially the same as that of FIG. 2, except that an amplifier 103 is also integrated (e.g., integrally formed) with the solar cell array 100 and the voltage converter 102 on a common substrate (e.g., same substrate).

The amplifier 103, for example, may be a GaN RF power amplifier (RF PA). For example, RF PA may require 24V or 28V as a drain voltage (Vd) input to operate. However, the voltage generated by solar cells may vary, and the band gap typically allows only certain voltage to be generated. For example, a voltage that can be supplied by a solar cell is typically significantly less (e.g., 6 V generated by 3 cells in a series with 2V per cell) than that required to operate a GaN RF PA. Hence, it is difficult to integrate solar cells together with a RF PA on a common substrate. In embodiments according to the present invention, by integrating GaN DC-DC converter 102 on the same substrate as the InGaN solar cell array 100 and the GaN RF PA, monolithic integration of the InGaN solar cell array and the GaN RF PA may be achieved.

Figure 5:
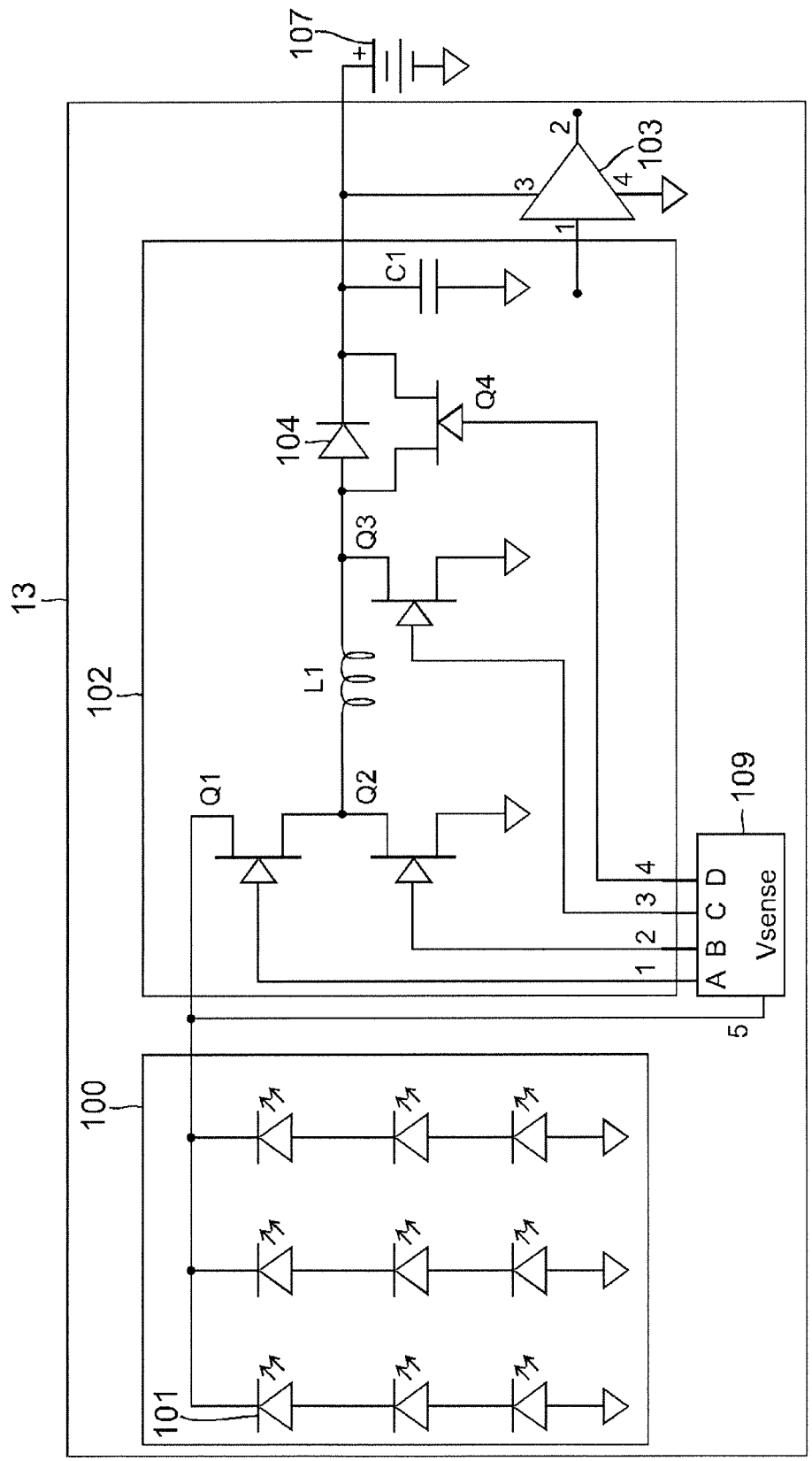
FIG. 5 is a schematic circuit diagram of a single monolithic integrated circuit containing a solar cell array including solar cells, and coupled to a voltage converter, an amplifier and a controller according to an embodiment of the present invention.

FIG. 5 is a schematic circuit diagram of a single monolithic integrated circuit 13 containing a solar cell array 100 including solar cells 101, and coupled to a voltage converter 102, an amplifier 103, and a controller 109, such that the solar cells 101, the voltage converter 102, the amplifier 103, and the controller 109 are co-located on the same chip, according to an embodiment of the present invention. As can be seen in FIG. 5, the output of the voltage converter 102 is also provided to a storage device 107, which may be a rechargeable battery (e.g., a lithium battery).

The controller 109 may be used to provide control signals A, B, C, D in response to the output voltage of the solar cell array 100 that it senses. For example, the controller 109 may vary the duty cycle of the pulse width modulation (PWM) signal it generates to drive the voltage converter 102, in accordance with the sensed output voltage from the solar cell array 100. Hence, a feedback loop may be achieved using the controller 109. The controller 109, for example, may be a microcontroller, and may be implemented using CMOS technology. The feedback, for example, may be used to track and operate the single monolithic integrated circuit at a maximum power point (MPP), which is the point at which power is maximized through appropriate current-voltage (I-V) relationship.

Figure 6A:
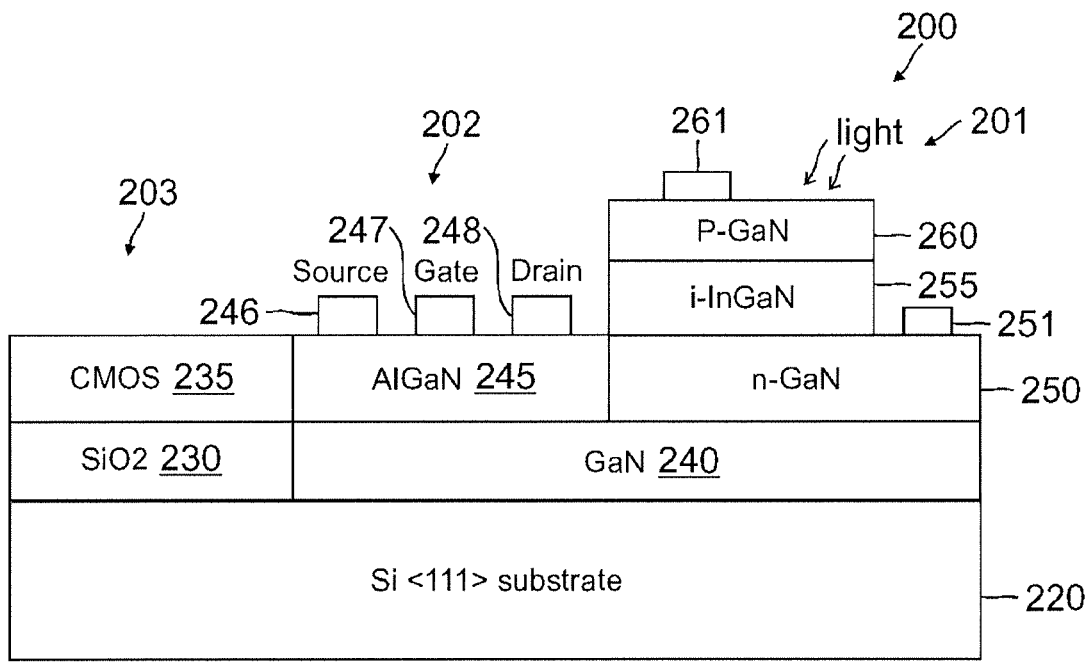
FIG. 6A is a schematic cross-sectional diagram of a CMOS device, a gallium nitride (GaN) device and an indium gallium nitride (InGaN) solar cell integrated (e.g., monolithically integrated) on a silicon substrate according to an embodiment of the present invention.
Figure 6B:
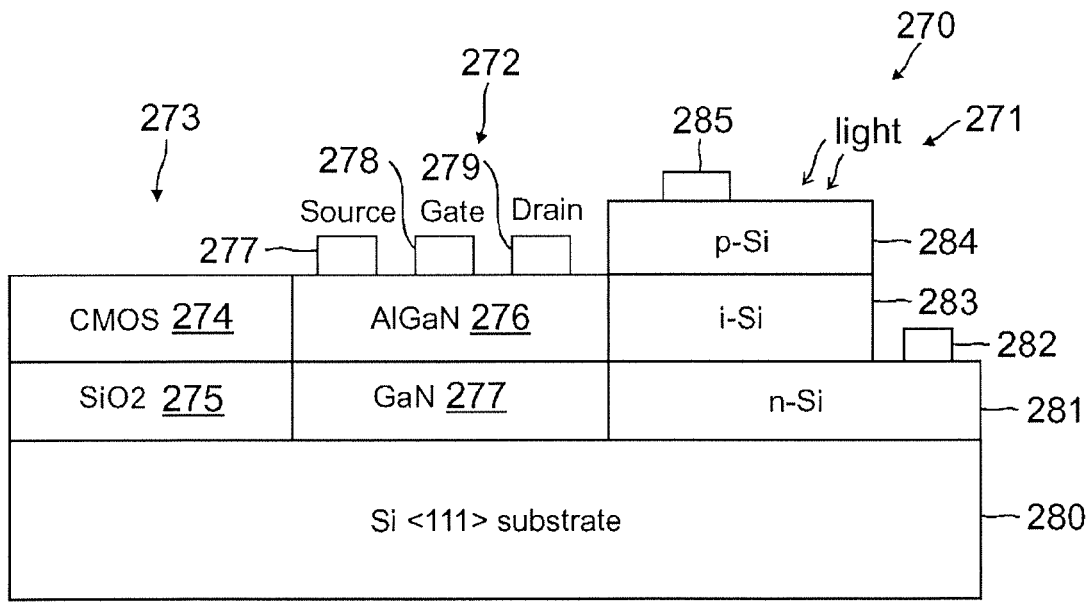
FIG. 6B is a schematic cross-sectional diagram of a CMOS device, a gallium nitride (GaN) device and a silicon solar cell integrated (e.g., monolithically integrated) on a silicon substrate according to an embodiment of the present invention.

FIG. 6A is a schematic cross-sectional diagram of a CMOS device 203, a GaN device 202 and an InGaN solar cell 201 integrated (e.g., monolithically integrated) on a silicon (Si) substrate 220, such that the CMOS device 203, the GaN device 202 and the InGaN solar cell 201 are co-located on the same chip, according to an embodiment of the present invention. FIG. 6B is substantially the same as FIG. 6A, except that the solar cell is a silicon solar cell. As the structure of the monolithically integrated chip of FIG. 6B is substantially the same as that of FIG. 6A except for the type of solar cell, some of the redundant descriptions may be omitted.

As can be seen in FIG. 6A, the integrated structure 200 is formed on the Si substrate (e.g., Si <111> substrate) 220. The CMOS device 203 includes a CMOS layer 235 formed on a silicon dioxide ($SiO_2$) buffer (or insulation) layer 230 that is first formed on the Si substrate 220. The CMOS device 203, for example, may be a controller, such as the controller (or microcontroller) 109 of FIG. 5. Those skilled in the art would appreciate that in view of the different operational voltages required by the CMOS and GaN devices, a number of level shifters (not shown) may be used to interface between the CMOS and GaN devices. The level shifters and other interface circuitry, for example, may include CMOS and/or GaN devices.

In the GaN device 202, a first GaN layer 240 is formed on the Si substrate 220 to a thickness of about 2 μm, for example. A GaN transistor (e.g., GaN HEMT) is formed at the GaN layer 240. Then an AlGaN layer 245 is formed on the GaN layer 240 to a thickness of about 25 nm, for example. Source, gate and drain contacts 246, 247 and 248 are formed on the AlGaN layer 245, and respectively correspond to source, gate and drain regions of the GaN transistor (e.g., GaN HEMT). For example, the Ga source may be trimethylgallium, N source may be ammonia, and In source may be trimethylindium, but the present invention is not limited thereto.

The InGaN solar cell 201 is integrated on the same silicon substrate as the GaN device 202. First, a second GaN layer 250 is formed on the first GaN layer 240 and doped with n-type material, for example, silane. The second GaN layer 250, for example, may have a thickness of about 350 nm. An InGaN layer 255 (e.g., intrinsic InGaN or i-InGaN layer) is grown on the GaN layer 250. The InGaN layer 255, for example, may be grown using molecular beam epitaxy (MBE), and may have a thickness of about 150 nm, for example. The InGaN epitaxial layer may be grown at 750° C., for example. On top of the InGaN layer 255, a third GaN layer 260 is formed and doped with p-type material, for example, Mg. The thickness of the third GaN layer 260, for example, may be 50 nm.

The absorption coefficient α of $In_{0.1}Ga_{0.9}N$ is $1\times10^{-7}$ m=100 nm. Here, 95% of the light is absorbed within 3α (300 nm) and 99% of the light is absorbed within 5α (500 nm). In one embodiment, the thicknesses of the second GaN layer 250, the InGaN layer 255, and the third GaN layer 260 are set as 350 nm, 150 nm, and 50 nm, respectively.

An n-contact 251 is formed on the second GaN layer 250. The n-contact 251 may be formed of any suitable metal such as an alloy of titanium/aluminum (Ti/Al) or titanium/gold (Ti/Au) or any other suitable material known to those skilled in the art. A p-contact 261 is formed on the third GaN layer 260. The p-contact 261 may be formed of any suitable metal such as an alloy of nickel/gold (Ni/Au) or palladium/gold (Pd/Au) or any other suitable material known to those skilled in the art.

As such, in exemplary embodiments according to the present invention, both CMOS and GaN devices are monolithically integrated on the same Si substrate. Examples of a similar integration on a Si substrate is provided, for example, in U.S. Pre-Grant Publication No. 2011/0180857 entitled "Structure Having Silicon CMOS Transistors with Column III-V Transistors on a Common Substrate," the entire content of which is incorporated by reference herein.

As can be seen in FIG. 6B, an integrated structure 270 is formed on a Si substrate (e.g., Si <111> substrate) 280. A CMOS device 273 includes a CMOS layer 274 formed on a silicon dioxide ($SiO_2$) buffer (or insulation) layer 275 that is first formed on the Si substrate 280. The CMOS device 273, for example, may be a controller, such as the controller (or microcontroller) 109 of FIG. 5. Those skilled in the art would appreciate that in view of the different operational voltages required by the CMOS and GaN devices, a number of level shifters (not shown) may be used to interface between the CMOS and GaN devices.

In a GaN device 272, a first GaN layer 277 is formed on the Si substrate 280 to a thickness of about 2 μm, for example. A GaN transistor (e.g., GaN HEMT) is formed at the GaN layer 277. Then an AlGaN layer 276 is formed on the GaN layer 277 to a thickness of about 25 nm, for example. Source, gate and drain contacts 277, 278, 279 are formed on the AlGaN layer 276, and respectively correspond to source, gate and drain regions of the GaN transistor (e.g., GaN HEMT). For example, the Ga source may be trimethylgallium, N source may be ammonia, and In source may be trimethylindium, but the present invention is not limited thereto.

The integrated structure (e.g., the single monolithic integrated circuit) 270 of FIG. 6B is different from the integrated structure (e.g., the single monolithic integrated circuit) 200 of FIG. 6A in that s silicon solar cell is integrated with the GaN device. The silicon solar cell includes a first silicon layer 281 doped with n type material, a second silicon layer 283 (e.g., intrinsic silicon or i-Si layer), and a third silicon layer 284 doped with p type material. The first silicon layer may have a thickness of 2 μm, or example. The second silicon layer 283 may have a thickness of 100 μm, for example, and the third silicon layer 284 has a thickness of 0.5 μm, for example. A contact 282 for the n-type silicon layer 281 may be made of a suitable material such as titanium (Ti), aluminum (Al), gold (Au), and/or an alloy thereof. A contact 285 for the p-type silicon layer 284 is made of a suitable material such as nickel (Ni)/gold (Au) or palladium (Pd)/gold (Au), and/or an alloy thereof.

Figure 7:
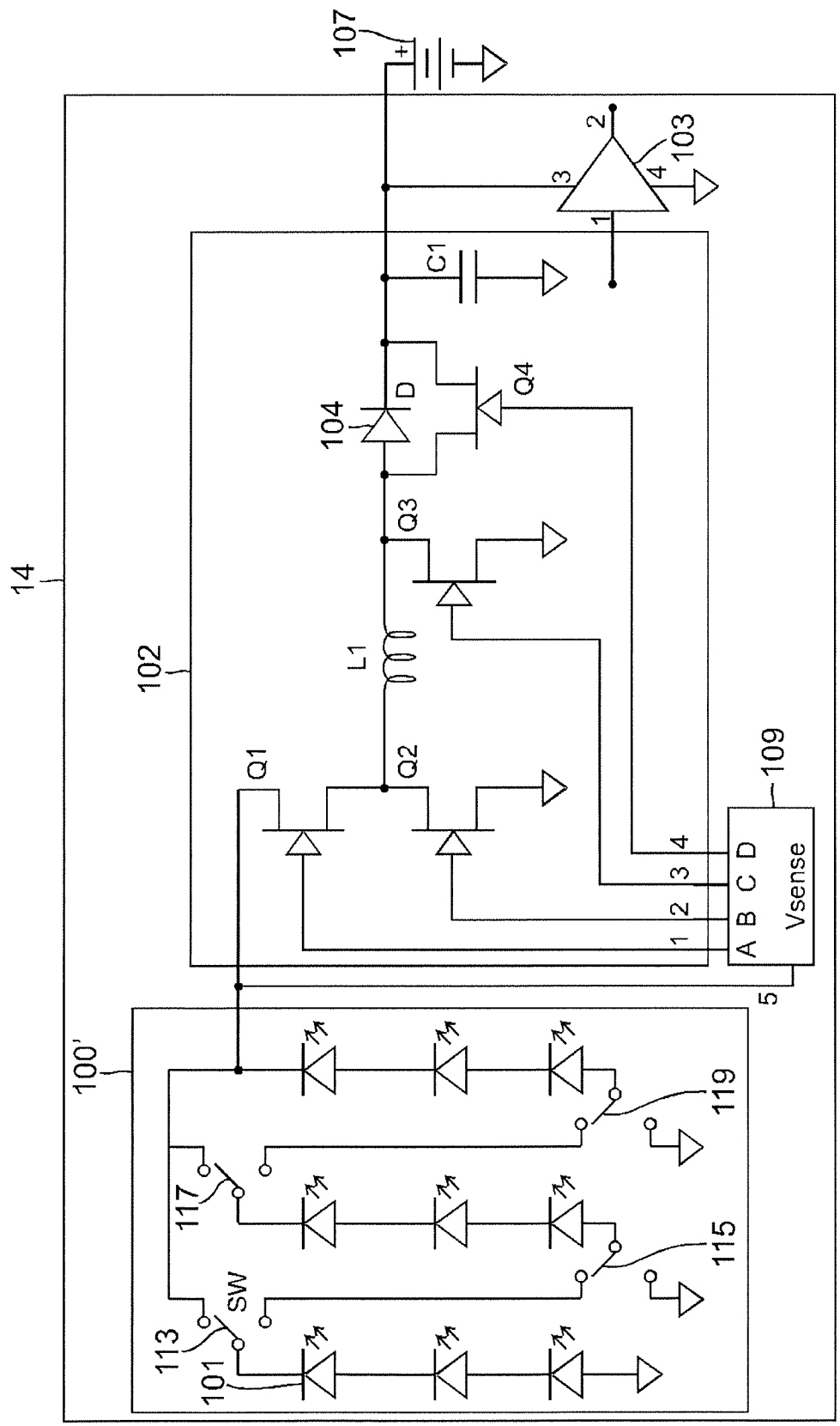
FIG. 7 is a schematic circuit diagram of a single monolithic integrated circuit containing a solar cell array including solar cells, and coupled to a voltage converter, an amplifier, a controller, and switches according to an embodiment of the present invention.

FIG. 7 is a schematic circuit diagram of a single monolithic integrated circuit 14 containing a solar cell array 100' including solar cells 101, and coupled to a voltage converter 102, an amplifier 103, a controller 109, and switches 113, 115, 117 and 119, such that the solar cell array 100', the voltage converter 102, the amplifier 103, the controller 109, and the switches 113, 115, 117 and 119 are co-located on the same chip, according to an embodiment of the present invention. The circuit of FIG. 7 is substantially the same as that of FIG. 5, except that the solar cell array 100' includes switches 113, 115, 117 and 119. These switches may be used to couple the solar cell columns in series or parallel. For example, the solar cell columns may be coupled together in parallel when the switches 113 and 117 are used to couple the output of respective first and second solar cell columns to the output of the solar cell array 100' and the switches 115 and 119 are used to couple respective second and third solar cell columns to a reference voltage (e.g., ground). Further, the solar cell columns may be coupled together in series when the switches 113 and 115 are used to couple the first solar cell column to the second solar cell column, and the switches 117 and 119 are used to coupled the second solar cell column to the third solar cell column.

When the solar cells are InGaN solar cells, the switches 113, 115, 117 and 119 may be integrated on the same substrate as that of the solar cell array 100'. In such case, the switches 113, 115, 117 and 119 may be GaN transistors (e.g., GaN FETs or HEMTs). For example, such monolithic integration of the solar cell array 100' and the switches 113, 115, 117 and 119 may be achieved on a SiC substrate as shown in FIG. 3 or on a Si substrate as shown in FIG. 6. The GaN switching FETs or HEMTs are desirable for use as the switches 113, 115, 117 and 119 because of their low on-resistance, so as to reduce or minimize power loss through the switches.

Figure 8:
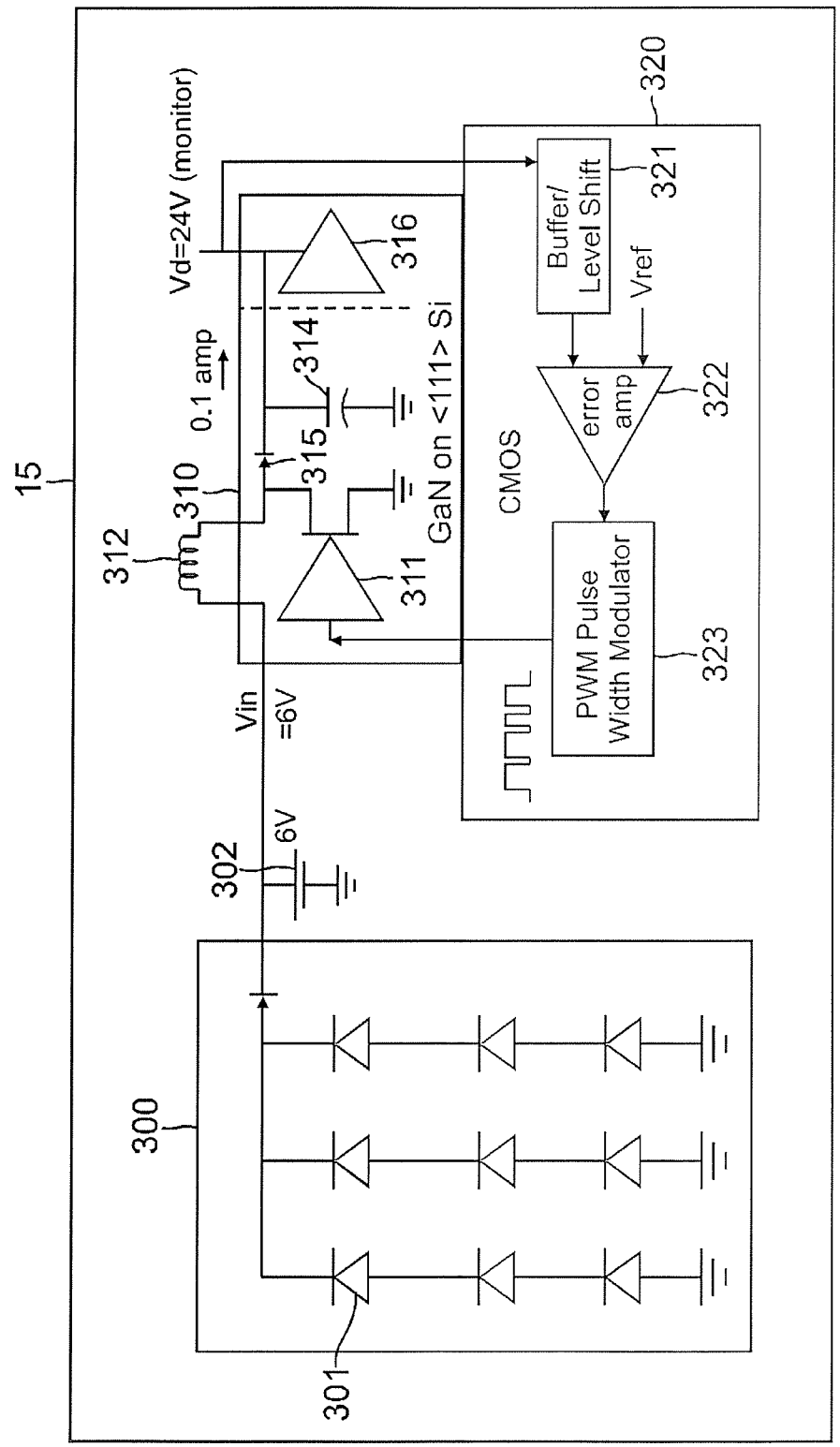
FIG. 8 is a schematic circuit diagram of a single monolithic integrated circuit containing a solar cell array including InGaN solar cells, and coupled to a GaN RF Power Amplifier (PA) and a CMOS pulse width modulator (PWM) with feedback, according to an embodiment of the present invention.

FIG. 8 is a schematic circuit diagram of a single monolithic integrated circuit 15 containing a solar cell array 300 including InGaN solar cells 301, and coupled to a GaN DC-DC boost converter and a GaN RF Power Amplifier (RF PA) 310 and a CMOS pulse width modulator (PWM) with feedback 320, such that the solar cell array 300, the GaN DC-DC boost converter and the GaN RF PA 310, and the CMOS PWM with feedback 320 are co-located on the same chip, according to an embodiment of the present invention.

The solar cell array 300, for example, generates an output power with a voltage of 6V. The output power is stored in a storage device 302, which may be a rechargeable battery such as, for example, a lithium battery. The output power is inputted into the GaN DC-DC boost converter that includes a gate driver 311, an inductor 312, a switching transistor (e.g., HEMT) 313, a diode 315, and a capacitor 314. The GaN DC-DC boost converter receives a PWM signal from a CMOS pulse width modulator 323 of the CMOS pulse width modulator (PWM) with feedback 320, which may be a CMOS circuit, for example. The output voltage of the GaN DC-DC boost converter may depend on the duty cycle of the input PWM signal. For example, with the input voltage of 6V from the solar cell array 300, the GaN DC-DC boost converter may generate an output voltage of 22V at the PWM duty cycle of 75%, or an output voltage of 24V at the PWM duty cycle of 80%. The output of the GaN DC-DC boost converter is provided to the GaN RF PA 316. Here, the GaN DC-DC boost converter and the GaN RF Power Amplifier (RF PA) 310 may be formed on a Si substrate (e.g., <111> Si substrate) together with CMOS circuitry (e.g., the CMOS pulse width modulator (PWM) with feedback 320).

The CMOS PWM with feedback 320 includes a PWM 323, an error amplifier 322, and a buffer/level shifter 321. The buffer/level shifter 321 receives the output of the GaN DC-DC converter, and shifts the voltage level to a level that is suitable for driving CMOS circuitry. The error amplifier 322 receives the output of the buffer/level shifter, and compares it against a reference voltage Vref. The result of the comparison (e.g., error signal or compare signal) is provided to the PWM 323 to vary the duty cycle of the PWM signal in an appropriate manner.

Figure 9A:
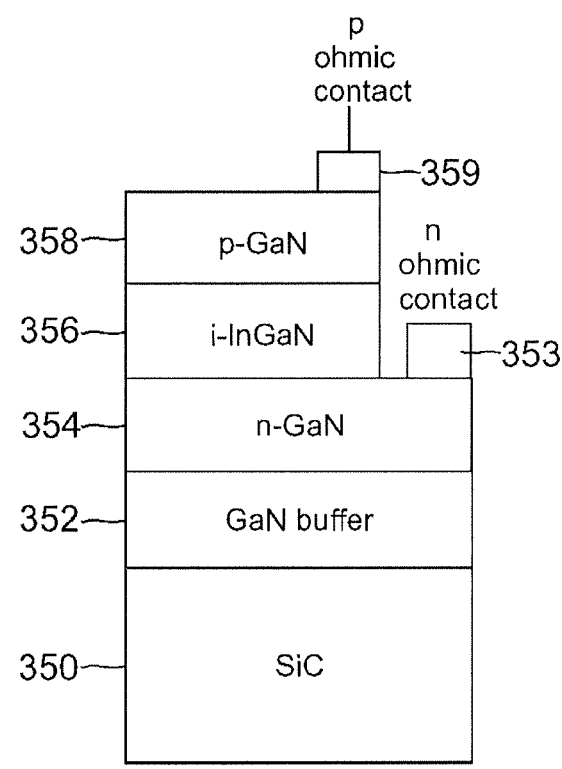
FIG. 9A is a schematic cross-sectional diagram that shows a structure of an InGaN solar cell according to an embodiment of the present invention.

FIG. 9A is a schematic cross-sectional diagram that shows a structure of an InGaN solar cell according to an embodiment of the present invention. The InGaN solar cell of FIG. 9A, for example, may have similar or substantially the same structure as the solar cells 101, 101', 201, 301 and/or 371 (of FIG. 9B). On a SiC substrate 350, a GaN buffer layer 352 is formed. A GaN layer 354 is formed on the GaN buffer layer 352, and is doped with n-type material. An InGaN layer 356 (e.g., an intrinsic InGaN layer or an i-InGaN layer) is formed on the n-GaN layer 354, and another GaN layer 358 is formed on the InGaN layer 356. The GaN layer 358 is doped with p-type material. An n ohmic contact 353 is formed on the n-GaN layer 354, and a p ohmic contact 359 is formed on the p-GaN layer 358. The p-type doping material may include magnesium (Mg), for example, and the n-type doping material may include silane, for example.

Figure 9B:
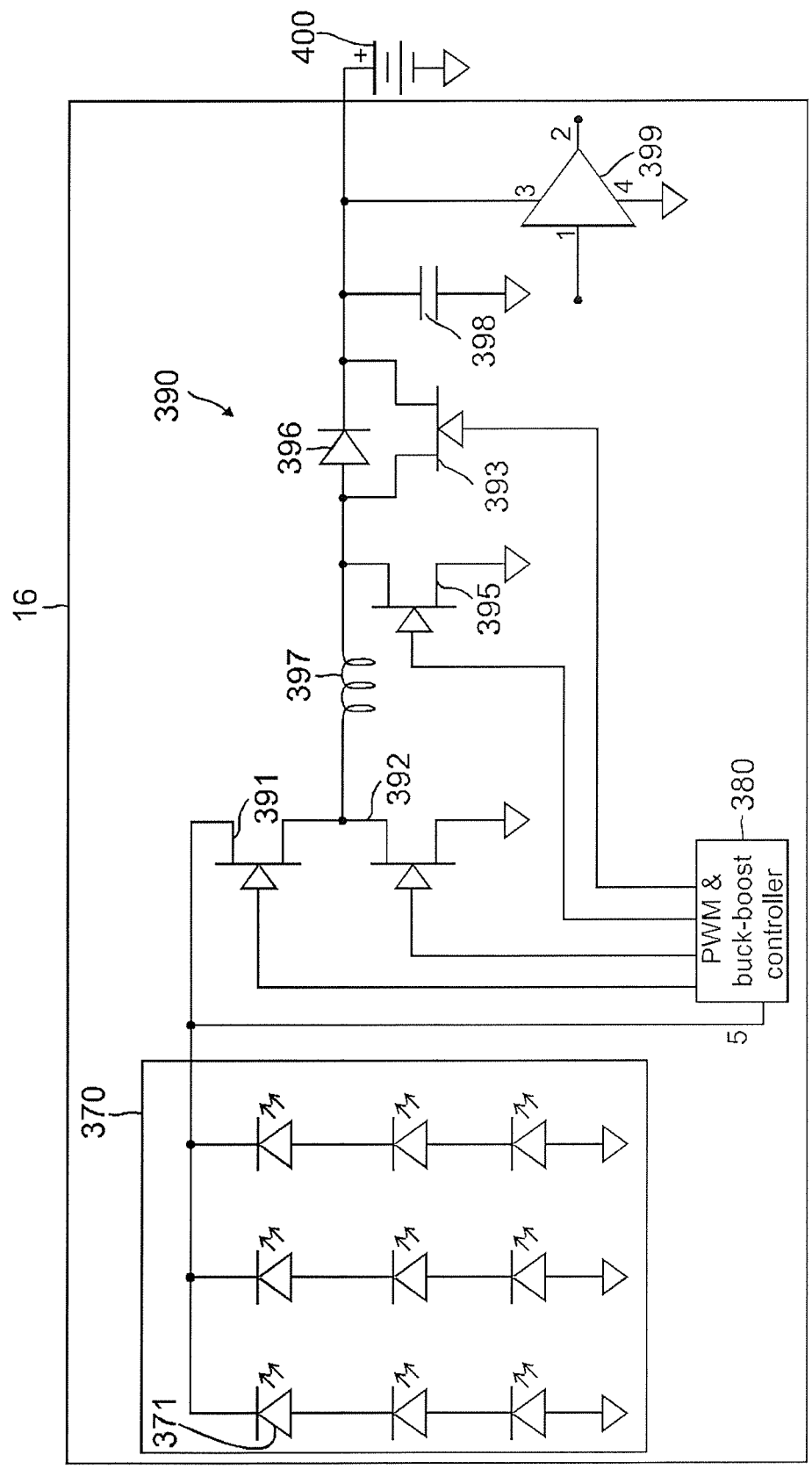
FIG. 9B is a schematic circuit diagram of a single monolithic integrated circuit containing a solar cell array including InGaN solar cells, coupled to a PWM controller and a buck-boost converter according to an embodiment of the present invention.

FIG. 9B is a schematic circuit diagram of a single monolithic integrated circuit 16 containing a solar cell array 370 including InGaN solar cells 371, coupled to a PWM & buck-boost controller 380 and a buck-boost converter 390, such that the solar cell array 370, the PWM & buck-boost controller 380, and the buck-boost converter 390 are co-located on the same chip, according to an embodiment of the present invention. The InGaN solar cell array 370 generates a voltage output that is provided to the buck-boost converter 390, and the PWM & buck-boost controller 380 adjusts the voltage output of the buck-booster converter 390 by varying the duty cycle of the output PWM signal. In this embodiment, the PWM & buck-boost controller 380 may be implemented in CMOS, and the buck-boost converter may be implemented in GaN. Therefore, level shift or gate drivers (not shown) may be needed to convert the voltage levels between the CMOS and GaN circuits.

The buck-boost converter 390 includes GaN transistors (e.g., GaN HEMTs) 391 and 392 that are coupled in series between the output of the solar cell array 370 and ground. The buck-booster converter 390 also includes an inductor 397, a diode 396, GaN transistors (e.g., GaN HEMTs) 393 and 395, and a capacitor 398.

Gates of the GaN transistors 391 and 392 receive as input PWM signals generated by the PWM controller 380. A first end of the inductor 397 is coupled to a node between the GaN transistors 391 and 392, and a second end of the inductor 397 is coupled to a first electrode of the GaN transistor 395. A second electrode of the GaN transistor 395 is coupled to ground, and a gate electrode of the GaN transistor 395 receives a first control signal from the PWM & buck-boost controller 380. The second end of the inductor 397 is also coupled to an anode of the diode 396, and a cathode of the diode 396 is provided as an output of the buck-booster converter 390. The cathode of the diode 396 is also coupled to a first terminal of the capacitor 398. A second terminal of the capacitor 398 is coupled to ground. A first electrode of the GaN transistor 393 is coupled to the second end of the inductor 397, and a second electrode of the GaN transistor 393 is coupled to the cathode of the diode 396 at the output of the buck-boost converter 390. Hence, the GaN transistor 393 is coupled in parallel with the diode 396. A gate electrode of the GaN transistor 393 receives a second control signal from the PWM & buck-boost controller 380.

An amplifier 399 (e.g., RF power amplifier) is also integrated (e.g., integrally formed) with the solar cell array 370 and the buck-boost converter 390 on a common substrate (e.g., same substrate), and receives an output voltage of the buck-booster converter 390 (e.g., as a drain voltage Vd). The output of the buck-boost converter 390 may also be coupled to a rechargeable battery 400, such that power generated by the solar cells 371 may be stored in the rechargeable battery 400.

The band gap of $In_xGa_{1-x}N$ may be adjusted in accordance with the change in relative contents between indium and gallium in an embodiment according to the present invention. The solar cells may be fabricated using $In_xGa_{1-x}N$, and the band gap of the solar cells depends on the content ratio of indium and gallium. For example, the band gap Eg of InGaN can be varied from 0.7 eV ($\lambda$=1.77 μm) to 3.4 eV ($\lambda$=364 nm). Hence, band gap engineering can be used to absorb most of solar spectrum. The band gap of InGaN, for example, can be found by $Eg(x)=0.7x+3.4(1-x)-1.43\times(1-x)$, where the InGaN material used is $In_xGa_{1-x}N$.

For instance, by tuning band gaps through varying In content from 10% to 40% to match sun spectrum, maximum or improved solar energy collection may be achieved. This way, indium content in InGaN solar cells may be optimized or improved. Further, by stacking multiple InGaN layers (or multiple InGaN solar cells) one on top of another to have multiple junctions, the solar cells may be used to absorb multiple different regions of the solar spectrum. For instance, the InGaN band gap may be optimized to the solar spectrum to absorb the highest amount of energy. By way of example, 10% indium InGaN may absorb 420 nm blue light, 20% indium InGaN may absorb 500 nm green light, and 35% indium InGaN may absorb 640 nm red light. Further, the band gap of InGaN may be engineered to absorb the infrared light of the sun, which accounts for over 50% of the incoming AM1.5 solar spectrum, which corresponds to shallower sun angle that may increase atmospheric path length by 50%.

Further, for example, light of wavelength having higher energy is typically absorbed sooner (e.g., at less depth). Hence, when multi junction InGaN solar cells are fabricated according to embodiments of the present invention, the multi junction InGaN solar cells may be engineered with smaller bandgap at the bottom of the cell, such that the bottom of the cell having smaller bandgap can be used to absorb longer wavelengths. For example, in InGaN solar cells in embodiments according to the present invention, the bandgap may be engineered from GaN where bandgap Eg=3.42 eV, to InN where bandgap Eg=0.7 eV, per the equation for the bandgap of InGaN: $In_xGa_{(1-x)}N$: $Eg(x)=0.7x+3.4(1-x)-1.43\times(1-x)$.

Hence, InGaN band gap may be improved or optimized to solar spectrum while use of GaN may result in very efficient switches. The monolithic integration of power source (InGaN solar cells) and voltage converter (DC-DC converter including GaN switching FETs (e.g., HEMTs)) reduces the number of parts and improves energy efficiency. When buck-boost converter is used, the output voltage of the voltage converter can be below or above the input voltage generated by the solar cell array. The use of GaN switching FETs (e.g., HEMTs) for the DC-DC-converter, as GaN FETs (e.g., HEMTs) have relatively low Ron-resistance (lower than Si and lower than SiC), reduces or minimizes the wasted energy (heat) through the channel.

Further, because GaN devices (e.g., HEMTs) have very high thermal conductivity, they may transfer heat away quicker. One of the problems with the solar cells is that when their temperature rises, they become less efficient (e.g., because bandgap decreases with temperature). The monolithically integrated circuit formed on the substrate, in embodiments according to the present invention, is typically mounted on a heat sink. By maximizing the transfer of heat to the heat sink, the temperature of the solar cells may be lowered, thereby improving or optimizing power generation given the same amount of sun light.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A single monolithic integrated circuit (10, 11, 12, 13, 14, 15, 16) containing solar cells with a voltage converter, comprising:
   a substrate (120, 220);
   two or more solar cells (101, 301, 371) on the substrate and configured to generate an output voltage, wherein the two or more solar cells (101, 301, 371) comprises indium gallium nitride (InGaN) solar cells (101, 101', 301, 371) or silicon solar cells;
   the voltage converter (102, 390) integrally formed on the substrate (120, 220) with the two or more solar cells, the voltage converter (102, 390) comprising gallium nitride (GaN) and being configured to receive the output voltage and to generate a converted voltage,
     wherein the voltage converter is controllable to boost or reduce the output voltage received from the two or more solar cells in accordance with a voltage requirement and a current requirement of a load;
   a plurality of field-effect transistor (FET) switches; and
   a controller (109) integrated on the substrate with the solar cells and the voltage converter, wherein the controller is a CMOS controller, and the controller is configured to couple the two or more solar cells in parallel or series configuration by controlling the plurality of field-effect transistor (FET) switches in accordance with the voltage requirement and the current requirement of the load, and
   wherein respective bottom surfaces of the controller, the voltage converter, and at least one of the two or more solar cells are each positioned on the same surface of the substrate.

2. The single monolithic integrated circuit of claim 1,
   wherein the two or more solar cells (101, 301, 371) comprises indium gallium nitride (InGaN) solar cells (101, 101', 301, 371), and
   wherein the InGaN solar cells (101, 101', 301, 371) comprise at least first and second InGaN layers having different content ratios of indium (In) and gallium (Ga) with respect to each other.

3. The single monolithic integrated circuit of claim 2, wherein the first and second InGaN layers are stacked one on top of another, so as to absorb different regions of solar spectrum of same solar rays.

4. The single monolithic integrated circuit of claim 1, further comprising:
   wherein the two or more solar cells (101, 301, 371) comprises indium gallium nitride (InGaN) solar cells (101, 101', 301, 371), and
   a gallium nitride (GaN) RF power amplifier (RF PA) (103, 316) integrally formed on the substrate with the InGaN solar cells and the voltage converter.

5. The single monolithic integrated circuit of claim 4, wherein the voltage converter comprises a GaN DC-DC converter (102, 390).

6. The single monolithic integrated circuit of claim 5, wherein the GaN DC-DC converter comprises a buck converter, a boost converter, or a buck-boost converter (390).

7. The single monolithic integrated circuit of claim 1, wherein the substrate comprises a silicon substrate (220).

8. The single monolithic integrated circuit of claim 1, wherein the CMOS controller comprises a PWM controller configured to generate PWM signals to control the voltage converter.

9. The single monolithic integrated circuit of claim 1,
wherein the two or more solar cells (101, 301, 371) comprises indium gallium nitride (InGaN) solar cells (101, 101', 301, 371), and
wherein the plurality of field-effect transistor (PET) switches comprise GaN switches (113, 115, 117, 119) integrally formed on the substrate with the InGaN solar cells.

10. The single monolithic integrated circuit of claim 1, wherein the substrate is a silicon carbide (SiC) substrate, a sapphire substrate, or a silicon substrate.

11. The single monolithic integrated circuit of claim 1, further wherein the controller (109) is configured to control the plurality of field-effect transistor (FET) switches to configure individual ones of the solar cells in parallel or serial configuration in accordance with at least one of a voltage requirement or a current requirement of a load.

12. A single monolithic integrated circuit (10, 11, 12, 13, 14, 15, 16) containing solar cells with a voltage converter, comprising:
a substrate (120, 220);
a solar cell array (100, 100', 300, 370) comprising the solar cells (101, 101', 301, 371), on the substrate and configured to generate an output voltage;
the voltage converter (102, 390) integrally formed on the substrate (120, 220) with the solar cell array (100, 100', 300, 370), the voltage converter (102, 390) being configured to receive the output voltage and to generate a converted voltage; and
a controller integrally formed on the substrate with the solar cell array and the voltage converter, and configured to be a feedback loop for maintaining an output voltage range of the single monolithic integrated circuit, and
wherein respective bottom surfaces of the controller, the voltage converter, and at least one of the solar cells are each positioned on the same surface of the substrate.

13. The single monolithic integrated circuit of claim 12, wherein the controller comprises a CMOS pulse width modulator (323), an error amplifier (322), and a buffer/level shifter (321), and wherein the buffer/level shifter is configured to receive the output voltage from the voltage converter and shift the voltage level to a level for driving CMOS circuitry.

14. A single monolithic integrated circuit (10, 11, 12, 13, 14, 15, 16) containing a solar cell or solar cells with a voltage converter, comprising:
a substrate (120, 220);
one or more solar cells (101, 301, 371) on the substrate and configured to generate an output voltage;
the voltage converter (102, 390) integrally formed on the substrate (120, 220) with the one or more solar cells, the voltage converter (102, 390) being configured to receive the output voltage and to generate a converted voltage; and
a controller (109) integrated on the substrate with the one or more solar cells and the voltage converter, and configured to provide control signals (A, B, C, D) to the voltage converter in response to the output voltage,
wherein respective bottom surfaces of the controller, the voltage converter, and at least one of the one or more solar cells are each positioned on the same surface of the substrate, and
wherein the voltage converter comprises first, second, third and fourth transistors (Q1, Q2, Q3, Q4) having gates configured to receive the control signals from the controller.

* * * * *